United States Patent
Luu et al.

(10) Patent No.: US 6,970,051 B2
(45) Date of Patent: Nov. 29, 2005

(54) PULSE WIDTH MODULATOR CIRCUIT HAVING NEGATIVE BIAS

(75) Inventors: Ky Thoai Luu, Mason, OH (US); Wayne Douglas Duello, Hamilton, OH (US)

(73) Assignee: Harris Corporation, Melbourne, FL (US)

( * ) Notice: Subject to any disclaimer, the term of this patent is extended or adjusted under 35 U.S.C. 154(b) by 132 days.

(21) Appl. No.: 10/730,146

(22) Filed: Dec. 8, 2003

(65) Prior Publication Data

US 2005/0122183 A1    Jun. 9, 2005

(51) Int. Cl.[7] .............................................. H03K 7/08
(52) U.S. Cl. ...................... 332/109; 332/110
(58) Field of Search ................ 332/106, 107, 332/109–111; 327/172–177; 375/238

(56) References Cited

U.S. PATENT DOCUMENTS

2005/0122183 A1 *   6/2005   Luu et al. .................... 332/109

* cited by examiner

Primary Examiner—David Mis
(74) Attorney, Agent, or Firm—Tarolli, Sundheim, Covell & Tummino L.L.P.

(57) ABSTRACT

A pulse width modulator is presented herein and it includes a pulse width driver circuit that receives a time varying ramp signal that is modulated by a time varying analog input signal to produce a pulse width modulated drive signal comprised of turn-on pulses having widths that vary with variations in the magnitude of said input signal. A switch is turned on by each drive pulse for a time duration dependent upon the duration of each drive pulse and provides an output signal therefrom. A negative bias amplifier provides a negative bias signal that has pulsations that are synchronized with said drive pulses but of opposite phase. A combiner combines output signal with the negative bias signal to provide a combined output signal.

10 Claims, 4 Drawing Sheets

PULSE WIDTH MODULATOR CIRCUIT HAVING NEGATIVE BIAS

BACKGROUND OF THE INVENTION

1. Technical Field

The present invention relates to electronic devices and, more particularly, to an improved pulse width modulator circuit.

2. Description of the Prior Art

Pulse width modulation (PWM), sometimes referred to as pulse duration modulation (PDM), is a common method of amplifying an audio signal for high efficiency amplification. The technique is linear for large signals and can be used to achieve a very high power gain. The pulse width modulation is achieved by sampling an input audio signal relative to a symmetrical ramp signal. An output pulse width modulated signal is produced with the length of each pulse being indicative of the amplitude of the input signal over one cycle of the high frequency ramp signal. The pulses drive a switching device that amplifies the modulated pulse width signal. An output signal is then applied to a reconstruction filter to recover the amplified output signal.

Pulse width modulation varies the width of the output drive pulse based on the amplitude of the audio input signal. The width is longer for a higher level and shorter for a lower level. If the input signal level is zero, the pulse width will be represented as zero. Due to the practical limits of the switching speed and propagation delay of the transistor employed as the switch, pulse width distortion becomes noticeable as the pulse width becomes narrow. As the pulse width approaches zero, pulses become so narrow that the pulses are missed. This contributes to linear distortion and creates a sudden drop-out effect in the audio signal.

In an AM (amplitude modulated) transmitter system employed as in radio broadcasting, a pulse width modulator is cascaded with an RF amplifier, serving as a main power amplifier stage.

FIG. 1 illustrates a prior art pulse width modulation system 10. An input signal, as from an audio source 12, is supplied to a pulse generator control block 14 along with a symmetrical ramp signal from a ramp source 16. The pulse generator compares the two signals and outputs a voltage high signal during each period when the input signal from the audio source 12 exceeds the ramp signal. For each cycle of the ramp signal, the pulse generator 14 creates a pulse of a width dependent upon the signal amplitude during that cycle. This is known as the duty cycle of the signal, and the length of an individual pulse is described as a percentage of this duty cycle.

The pulses are referred to as drive pulses and these drive pulses are supplied as turn-on signals to a switch 18, which may take the form of a semi-conductor device known as a MOSFET. This switch, when turned on, passes a DC signal obtained from a DC voltage supply 20. This voltage pulse is then supplied to a load that includes a diode 22 and a reconstruction filter 24 and an output amplifier 26 which is driven by drive pulses in synchronism with those supplied to the switch 18. This places an amplified, but filtered, output signal across the primary winding of a transformer T1 having its secondary winding applied to a load L by way of an inductor-capacitor circuit 28.

FIG. 2 illustrates a series of graphs showing voltage with respect to time of various signals employed in the operation of the prior art circuit of FIG. 1. These include graphs 30, 32, 34, 36 and 38.

Graph 30 illustrates a ramp signal 40 from the ramp source 16 combining with the audio input signal 42 obtained from the audio source 12. This combination results in the pulse width drive pulses 44 shown in waveform 32. These pulses have widths that vary with the amplitude of the audio input signal 42.

The drive pulses 44 are supplied to the switch 18 providing a train of output pulses 46 as shown in the waveform 34. Because some of the drive pulses 44 are too narrow with respect to the turn-on/turn-off characteristics of the transistor 18, some of the pulses are missing. The PWM output pulses 46 are supplied to the reconstruction filter 24 to provide a reconstructed signal 48 as shown in waveform 36. This waveform, however, has a portion 50 which is distorted because of the missing pulses in the PWM output drive pulses 46. Consequently, the resulting RF output 52, as shown in waveform 38, is distorted at location 54 in this waveform.

SUMMARY OF THE INVENTION

The present invention is directed toward obviating the distortion characteristics noted above with respect to waveforms 34, 36 and 38 in FIG. 2. This is achieved in large measure by employing negative bias amplification.

In accordance with the present invention, the improved pulse width modulator circuit includes a pulse width driver circuit that receives a time varying ramp signal that is modulated by a time varying analog input signal to produce a pulse width modulator drive signal comprised of turn-on pulses having widths that vary with the variations in the magnitude of the input signal. A switch is turned on by each of the drive pulses for a time duration dependent upon the duration of each of the drive pulses and provides an output signal therefrom. A negative bias amplifier provides a negative bias signal that has pulsations that are synchronized with the drive pulses but are of opposite phase. The bias signal is combined with the output signal to provide a combined output signal.

BRIEF DESCRIPTION OF THE DRAWINGS

The foregoing and other features of the present invention will become apparent to one skilled in the art to which the present invention relates upon consideration of the following description of the invention with reference to the accompanying drawings, wherein.

DETAILED DESCRIPTION OF THE INVENTION

The present invention relates to pulse width modulation of an input signal. Typically, the input signal is an audio signal as in the case of a radio or television broadcasting system. In such a system, it is conventional for a pulse generator or the like to receive an input signal and a time varying ramp signal and produce a pulse width modulated drive signal comprised of turn-on pulses that have widths that vary with variations in the magnitude of the input signal. A switch isolates a load circuit from a voltage source. The switch is turned on by each of the drive pulses for a time duration dependent upon the duration of each drive pulse.

In accordance with the present invention, a negative bias amplifier provides a negative bias signal that has pulsations that are synchronized with the drive pulses but are of opposite phase.

Figure 3:
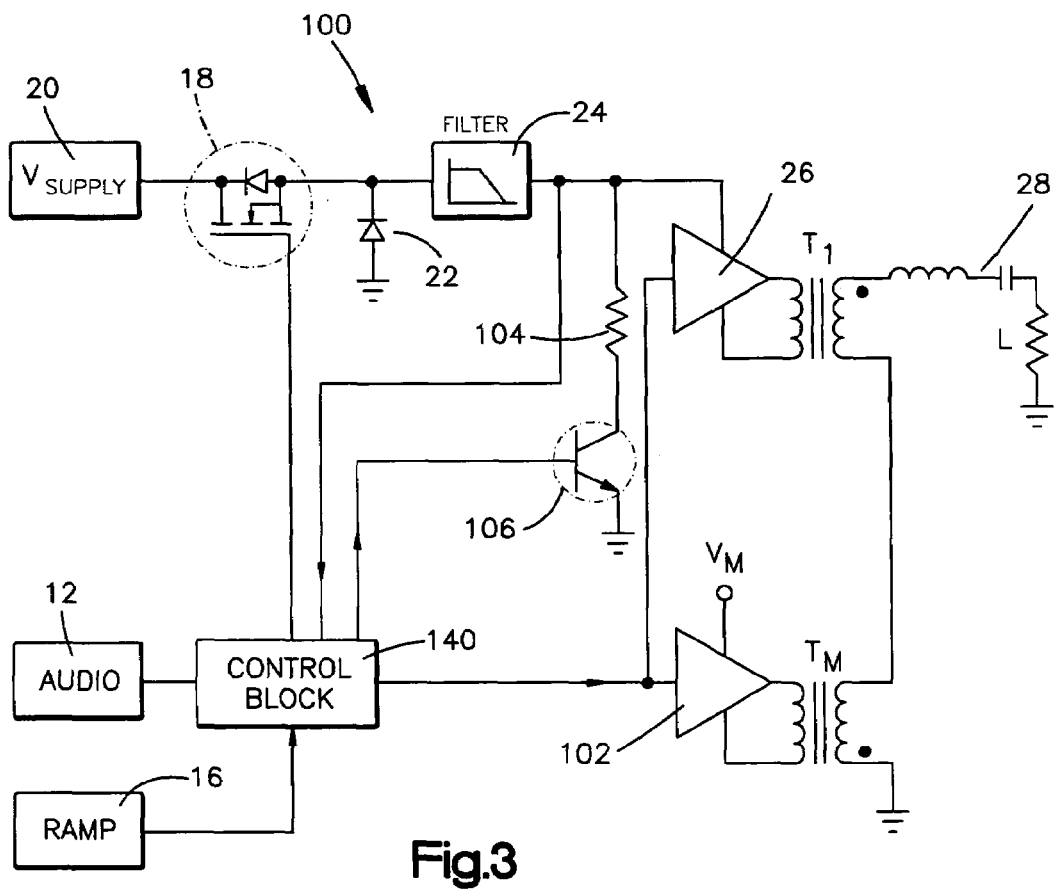
FIG. 3 illustrates a block diagram illustration of a preferred embodiment of the present invention.
Figure 4:
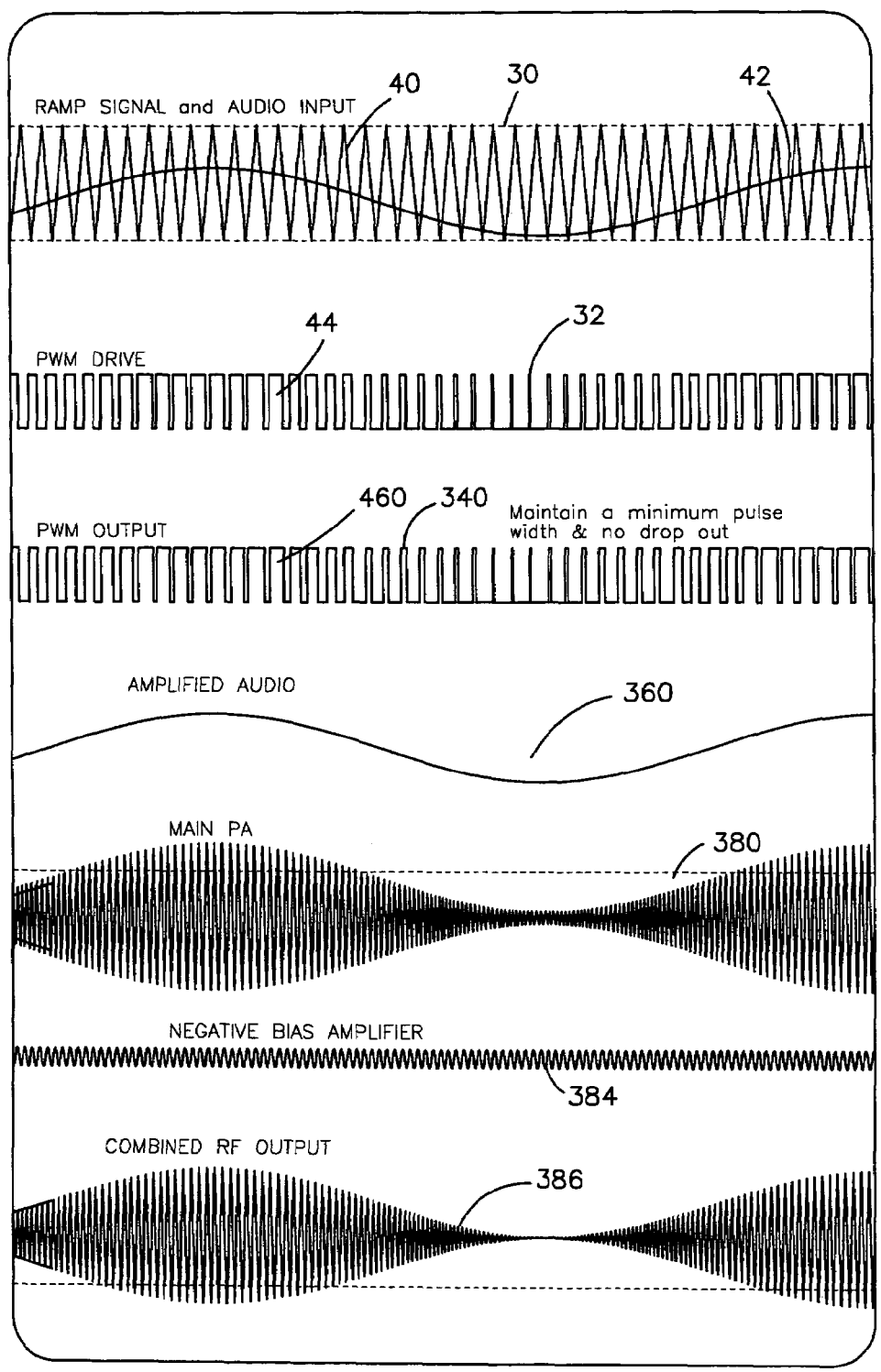
FIG. 4 illustrates a series of graphical waveforms of voltage with respect to time during the operation at various locations within the circuit of FIG. 3.

Reference is now made to FIG. 3 that illustrates an embodiment of the invention that is similar to the prior art circuit of FIG. 4 and, consequently, like components are identified with like character references to simplify the description herein.

Figure 1:
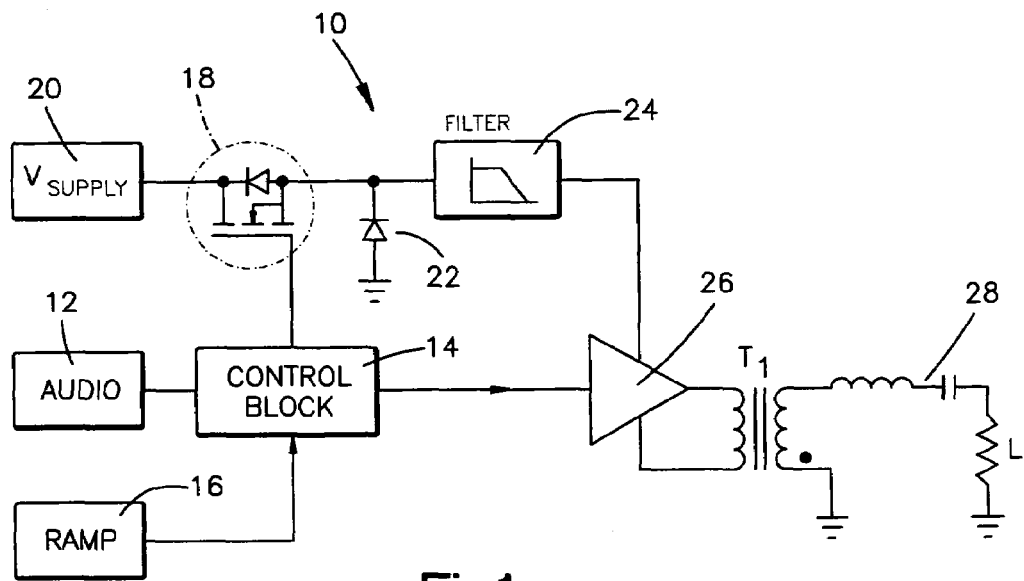
FIG. 1 illustrates a simplified block diagram illustration of a prior art pulse width modulator circuit.

The pulse width modulation circuit 100 in FIG. 3 as in the case of that shown in FIG. 1, employs a switch 18 that receives pulse width drive pulses from a control block 140 that receives an audio input signal from an audio source 12 and a ramp signal from a ramp source 16. Whenever the switch 18 is turned on, it connects a DC voltage supply source 20 to a filter 24 so that a filtered signal is then supplied to a main power amplifier 26. The amplifier is coupled to a load L by way of a transformer T1 and an output filter circuit 28. Thus far, the circuit of FIG. 3 compares favorably with that as illustrated in FIG. 1.

In accordance with the present invention, the circuit of FIG. 3 employs a negative bias amplifier 102 that supplies a pulsating negative bias to a transformer $T_M$ having a secondary winding connected in series with the secondary winding of transformer T1 and in series with the load L. This negative bias is 180° out of phase with that at the transformer T1 to create an effective null to maintain the pulse width modulator operating in the linear operating region.

Figure 2:
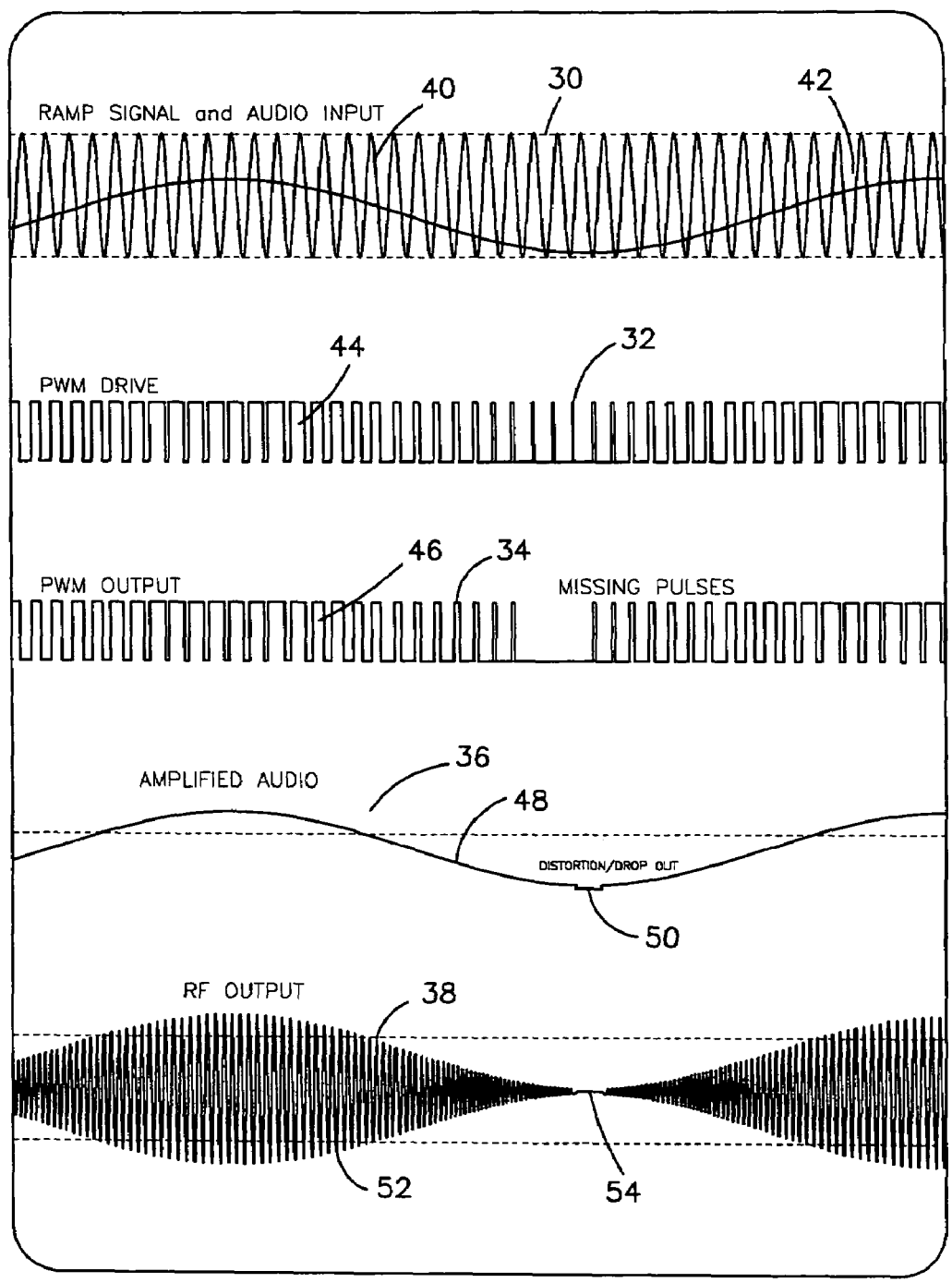
FIG. 2 illustrates a series of graphs of voltage with respect to time during the operation of various locations within the system of FIG. 1.

As shown in FIG. 4, the operation of the circuitry in FIG. 3 is similar to that of the waveforms in FIG. 2 relative to the operation of the circuitry in FIG. 1. As shown in FIG. 4, at waveforms 360 and 380, the modulator is never turned off in this embodiment of the invention, and hence, has a residual bias. The output signal of the main RF amplifier never reaches a zero level due to this residual bias.

Additionally, a small resistive load referred to as an active load 104 is periodically switched on by a switching transistor 106 controlled by the control block 140 while the opposite voltage summing occurs to maintain a continuous current flow through the modulator filter for good linearity. In the absence of this active load, current in the modulator filter may be interrupted during the zero RF output period.

The negative bias amplifier 102 is a constant level output RF amplifier having a constant level of $V_M$ with an output signal being 180° out of phase to the main power amplifier. Note that FIGS. 4 and 5 at waveforms 380, 384 and 386 show the details of the phase relationship of the negative bias amplifier relative to the main power amplifier. The 180° out of phase relationship is created by the reverse phase relationship of the output transformers $T_M$ and T1.

The combined RF output supplied to filter 28 is effective summation of the main power amplifier output in the negative bias amplifier output. This output RF signal is completely nullified if the negative bias amplifier level is exactly equal to the minimum bias level of the main power amplifier. A low distortion amplified audio signal is produced without the typical drop-out phenomenon noted above.

Figure 5:
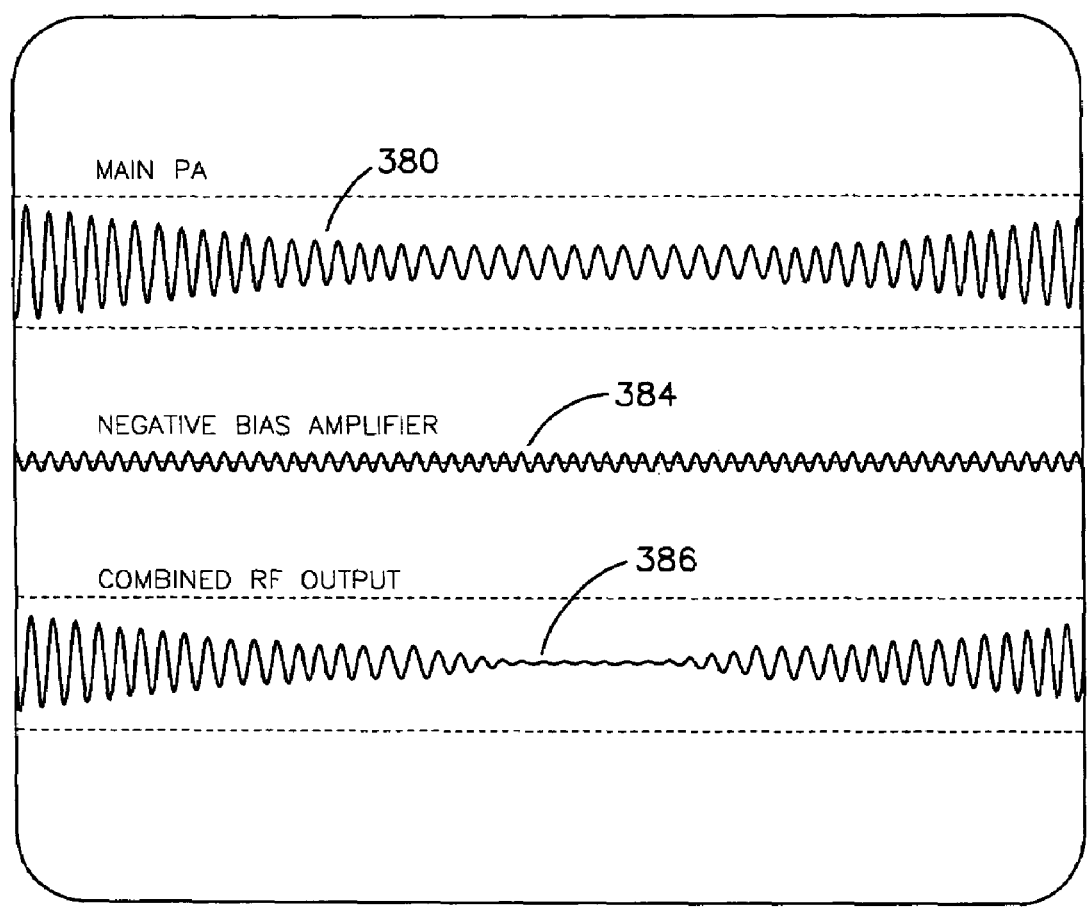
FIG. 5 illustrates enlarged waveforms taken from those shown in FIG. 4.

The RF signal of the negative bias amplifier as shown in waveform 384, is 180° out of phase with respect to that of the main power amplifier (see FIG. 5 waveform 380). When these two signals are added together, a zero output voltage is created if the magnitudes of the two signals are exactly the same.

A constant level for the negative bias amplifier is the simplest method to provide a negative bias offset and generate a zero combined RF output. This method will consume higher power and result in higher dissipation and lower efficiency in the negative bias amplifier. The bias amplifier output transformer $T_M$ is connected in series with the power amplifier transmitter transformer T1, and therefore, the secondary current in the combiner is the same.

An alternative method that may be used that can reduce a negative bias amplifier's output power is to perform an RF phase rotation while the amplitude of the power amplifier output is increasing. Thus, at minimum power amplifier outputs, the negative bias amplifier's output is exactly 180° opposite to the sum of the power amplifier output. This allows an out of phase cancellation of the output signal. As the amplitude of the power amplifier output is increasing, slow rotation of the RF drive of the negative bias amplifier is performed until the output phase is in phase with the rest of the power amplifier at an arbitrary output level. The advantage of this method is that the power dissipation of the negative bias amplifier is minimized, and has much higher efficiency because it has phase coherence with the rest of the power amplifier output. There is a slight distortion added to the modulation envelope using this technique.

It will be understood that the above description of the present invention is susceptible to various modifications, changes and adaptations and the same are intended to be comprehended within the meaning and range of equivalence of the appended claims.

We claim:

1. A pulse width modulator circuit, comprising:
   a pulse width driver circuit that receives a time varying ramp signal that is modulated by a time varying analog input signal to produce a pulse width modulated drive signal comprised of turn-on pulses having widths that vary with variations in the magnitude of said input signal;
   a switch turned on by each said drive pulse for a time duration dependent upon the duration of each said drive pulse and providing an output signal therefrom;
   a negative bias amplifier that provides a negative bias signal that has pulsations that are synchronized with said drive pulses but of opposite phase; and
   a combiner that combines said output signal with said bias signal to provide a combined output signal.

2. A modulator circuit as set forth in claim 1 wherein said switch includes a semiconductor switch for connecting a DC voltage supply source to a load by way of said switch.

3. A modulator circuit as set forth in claim 2 including a filter interconnected between said semiconductor switch and said load.

4. A modulator circuit as set forth in claim 3 including a power amplifier located intermediate said filter and said load and having an output circuit for providing said amplified output signal.

5. A modulator circuit as set forth in claim 4 wherein said output circuit of said power amplifier includes the secondary winding of a first transformer and wherein said negative bias amplifier provides said negative bias output signal at the secondary winding of a second transformer.

6. A modulator circuit as set forth in claim 5 wherein said combiner includes the secondary windings of said first and second transformers with said secondary windings being connected together in series for providing a summation function to provide said combined output signal.

7. A modulator circuit as set forth in claim 3 including an active load and a second switch for connecting the output of said filter to electrical ground by way of said active load each time a said turn-on drive pulse is provided by said driver circuit.

8. A modulator circuit as set forth in claim 7 wherein a power amplifier located intermediate said filter and said load and having an output circuit for providing said amplified output signal.

9. A modulator circuit as set forth in claim 8 including said output circuit of said power amplifier includes the secondary winding of a first transformer and wherein said negative bias amplifier provides said negative bias output signal at the secondary winding of a second transformer.

10. A modulator circuit as set forth in claim 9 wherein said combiner includes the secondary windings of said first and second transformers with said secondary windings being connected together in series for providing a summation function to provide said combined output signal.

* * * * *